United States Patent

Liu et al.

(10) Patent No.: US 6,331,472 B1
(45) Date of Patent: Dec. 18, 2001

(54) METHOD FOR FORMING SHALLOW TRENCH ISOLATION

(75) Inventors: Wan-Yi Liu, Kaohsiung; Pei-Ren Jeng, Hsinchu, both of (TW)

(73) Assignee: Macronix International Co., Ltd. (TW)

(*) Notice: Subject to any disclaimer, the term of this patent is extended or adjusted under 35 U.S.C. 154(b) by 0 days.

(21) Appl. No.: 09/725,065

(22) Filed: Nov. 29, 2000

(30) Foreign Application Priority Data

Oct. 11, 2000 (TW) ................................. 89121252

(51) Int. Cl.[7] .................................................. H01L 21/76
(52) U.S. Cl. .......................... 438/424; 438/426; 438/435; 257/510
(58) Field of Search ................................ 438/296, 424, 438/427, 435, 426; 257/510

(56) References Cited

U.S. PATENT DOCUMENTS

| | | | |
|---|---|---|---|
| 5,872,045 | * 2/1999 | Lou et al. | 438/432 |
| 5,930,646 | * 7/1999 | Gerung et al. | 438/427 |
| 5,976,951 | * 11/1999 | Huang et al. | 438/424 |
| 5,989,977 | * 11/1999 | Wu | 438/424 |
| 6,013,558 | * 1/2000 | Harvey et al. | 438/424 |
| 6,033,970 | * 3/2000 | Park | 438/424 |
| 6,037,018 | * 3/2000 | Jang et al. | 438/424 |
| 6,146,974 | * 11/2000 | Liu et al. | 438/424 |
| 6,180,467 | * 1/2001 | Wu et al. | 438/424 |
| 6,191,004 | * 2/2001 | Hsiao | 438/435 |
| 6,214,696 | * 4/2001 | Wu | 438/424 |

FOREIGN PATENT DOCUMENTS

| | | | |
|---|---|---|---|
| 019903597A1 | * 10/2000 | (DE) | H01L/21/762 |
| 62-31139 | * 2/1987 | (JP) | H01L/21/76 |
| 3-285344 | * 3/1991 | (JP) | H01L/21/76 |

* cited by examiner

*Primary Examiner*—Charles Bowers
*Assistant Examiner*—David S Blum

(57) ABSTRACT

A method for forming shallow trench isolation is disclosed. A pad oxide layer is formed on a substrate, and a mask layer is deposited on the pad oxide layer. The mask layer and the pad oxide layer are patterned to expose the substrate. Thereafter, the exposed substrate is subsequently etched to form a shallow trench. A lining oxide layer is formed by thermal oxidation on the shallow trench sidewalls. Afterwards, a silicon-rich oxide layer is deposited by high-density chemical vapor deposition (HDPCVD) process on the substrate and the shallow trench. Next, a silicon oxide layer is formed using the same HDPCVD process on the silicon-rich layer. Subsequently, an excess portion of silicon oxide and the silicon-rich oxide over the silicon nitride layer are effectively removed using some standard semiconductor processes. Eventually, the mask layer is removed and the pad oxide layer is stripped to form silicon oxide plug served as shallow trench isolation.

16 Claims, 3 Drawing Sheets

METHOD FOR FORMING SHALLOW TRENCH ISOLATION

FIELD OF THE INVENTION

The present invention generally relates to a method for manufacturing semiconductor devices, and more particularly, to a method for forming shallow trench isolation in semiconductor devices.

BACKGROUND OF THE INVENTION

With the fast developments of semiconductor process technology, the dimensions of integrated circuits (ICs) are rapidly scaled down into sub-micron level. Oxide isolation regions are usually incorporated with active areas of IC devices during the period of semiconductor processes. In general, a local oxidation (LOCOS) process is employed to form these oxide isolation regions, but the LOCOS process may induce a bird's beak structure such that the active areas of devices are unacceptably encroached. Therefore, a shallow trench isolation (STI) process is widely used to form isolation regions between active areas. The conventional process of manufacture for shallow trench isolation is shown in FIG. 1 and FIG. 2.

Referring to FIG. 1, a pad oxide layer 12 and a silicon nitride layer 14 are sequentially deposited on substrate 10, and then a shallow trench 16 is formed thereon by an etch process. A thermal oxidation process is followed to form a lining oxide layer 18 on sidewalls of the shallow trench 16. Next, a high-density plasma chemical vapor deposition (HDPCVD) is used to fill silicon oxide 19 into the shallow trench 16. The excess silicon oxide 19 over the silicon nitride layer 14 is totally removed by chemical-mechanical polishing (CMP).

Referring to FIG. 2, the silicon nitride layer 14 is stripped by hot phosphoric acid ($H_3PO_4$) and the pad oxide layer 12 is etched away by hydrofluoric acid (HF). At the time, a silicon oxide plug 22 is remained in the shallow trench 16. When the pad oxide layer 12 is being removed, the silicon oxide plug 22 and the lining oxide layer 18 are also simultaneously etched. Generally speaking, the etch rate of the pad oxide layer 12 formed by thermal oxidation is smaller than that of the silicon oxide plug 22 formed by HDPCVD when HF is used as an etchant. Consequently, recesses 20 located on the edge of silicon oxide plug 22 will result in current leakage and a sub-threshold voltage, which evokes many problems in device operations.

Further, while the silicon oxide 19 is deposited using HDPCVD process, the crystalline structure of shallow trench 16 surface may be damaged by a lot of ions induced by high-density plasma at the start-up time of the process. Furthermore, the isolation effect of the shallow trench 16 will severely downgrade after the silicon oxide plug 22 is entirely formed.

SUMMARY OF THE INVENTION

In view of the problems encountered with the foregoing conventional shallow trench isolation.

As a result, the primary object of the present invention is to provide a method for forming shallow trench isolation incorporated with a silicon-rich oxide layer, featured with low wet etching rate ratio and low plasma damage, using in-situ two-step deposition of HDPCVD process.

In the preferred embodiment of the present invention, a silicon-rich oxide layer used as protection layer for the shallow trench isolation is deposited by HDPCVD process. A pad oxide layer is formed on a substrate, and a mask layer is deposited on the pad oxide layer wherein the mask layer is formed by low-pressure chemical vapor deposition (LPCVD) and used as an etching mask. Afterwards, the pad oxide layer is used to prevent stress damage when the mask layer is deposited thereon. The mask layer and the pad oxide layer are patterned and the substrate is exposed. The exposed substrate is subsequently etched to form a shallow trench wherein the patterned silicon nitride layer is used as an etching mask. Subsequently, a lining oxide layer is formed by thermal oxidation on the shallow trench sidewalls. A silicon-rich oxide layer is deposited by HDPCVD process on the substrate and the shallow trench. Next, a silicon oxide layer is formed using the same HDPCVD process on the silicon-rich layer. The excess portion of silicon oxide and the silicon-rich oxide over the silicon nitride layer are effectively removed using some standard semiconductor processes, such as CMP or etching back. Thereafter, a silicon oxide plug, which serves as shallow trench isolation, is formed when the mask layer and the pad oxide layer are removed.

In summary, the process of manufacturing for shallow trench isolation is described in the present invention, wherein the silicon-rich oxide layer is used as protection for the silicon oxide plug from the recesses. Additionally, the damage of the inner surface of the shallow trench is effectively inhibited in the presence of a large amount of plasma ions, and the probability of current leakage is thereby decreased owing to the controlled defects between shallow trench and substrate. Most importantly, the throughput of manufacturing process according to the present invention will not be influenced, which in-situ two-step deposition is implemented, each step with the same HDPCVD process.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention provides a method for forming shallow trench isolation incorporated with a silicon-rich layer, featured with low wet etching rate ratio and low plasma damage, using in-situ two-step deposition of HDPCVD process.

As shown in FIGS. 3–6, these figures illustrate cross-sectional views of a process for forming shallow trench isolation in accordance with the present invention.

Figure 1:
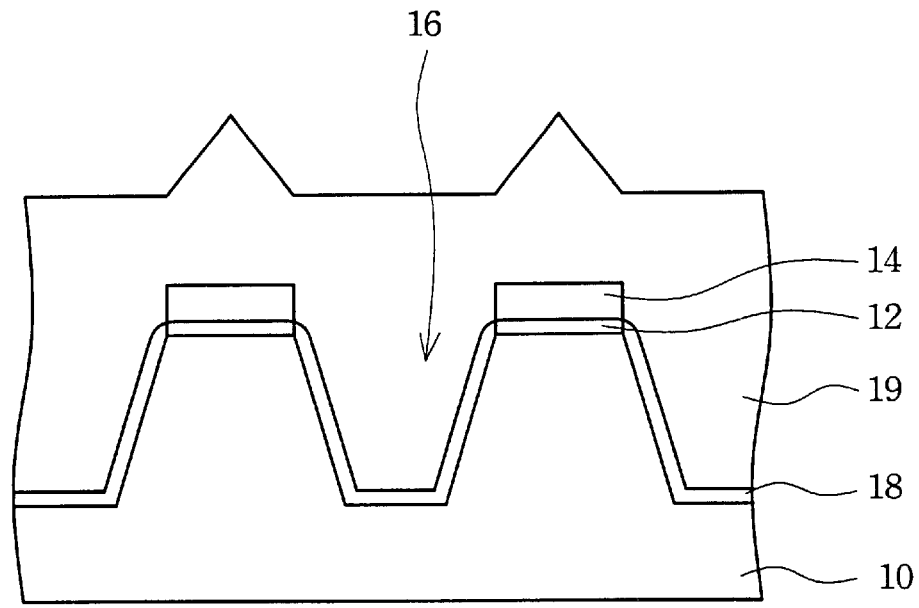
FIGS. 1–2 illustrate cross-sectional views of a conventional process for fabricating shallow trench isolation.
Figure 2:
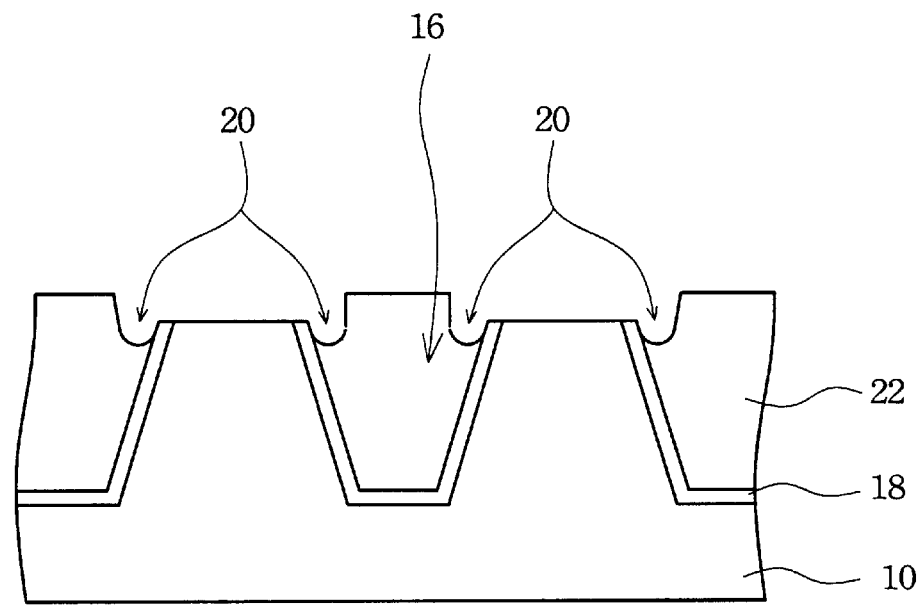
Figure 3:
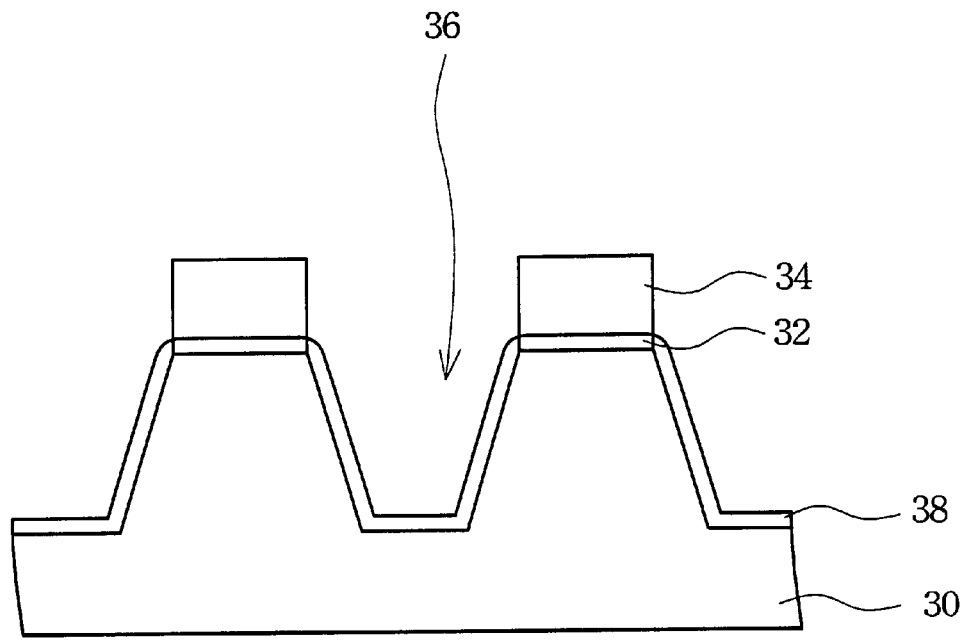
FIGS. 3–6 illustrate cross-sectional views of a process for fabricating shallow trench isolation according to the preferred embodiment of the present invention.

Referring FIG. 3, which illustrates the preferred embodiment of the present invention, a pad oxide layer 32 is formed on a substrate 30, and a mask layer 34 is deposited on the pad oxide layer 32 wherein the mask layer 34, such as silicon nitride layer, formed by low pressure chemical vapor deposition (LPCVD), is used as a etching mask, and the pad oxide layer 32 is used to prevent stress damage when the mask layer 34 is deposited thereon.

The mask layer 34 and the pad oxide layer 32 are patterned to expose a portion of the substrate 30. The exposed portion of the substrate 30 is subsequently etched to form a shallow trench 36, wherein the patterned silicon nitride layer is used as an etching mask. A lining oxide layer 38 is formed by thermal oxidation on the shallow trench 36 sidewalls so that the dangling bonds located on the surface of the shallow trench 36 can be effectively repaired.

Figure 4:
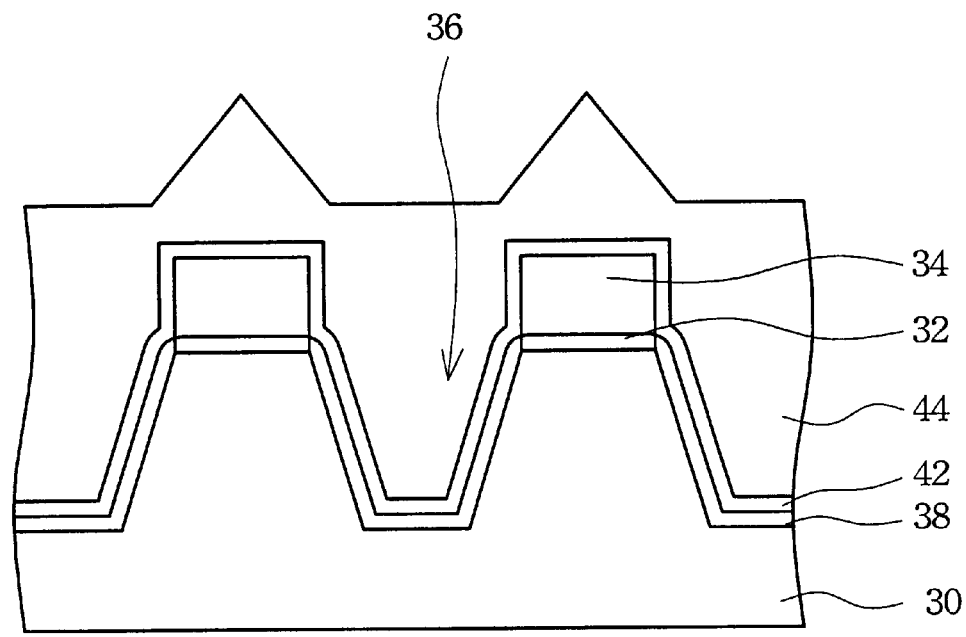

Referring to FIG. 4, a silicon-rich oxide layer 42, preferably having a thickness of between about 500 and about 2000 angstroms, is deposited by HDPCVD process on the substrate 30 and the shallow trench 36. As compared to the conventional deposition of a silicon oxide, the $O_2$ flow rate necessary for deposition in the present invention can be decreased. In other words, the silicon (Si) concentration of the silicon oxide is contrarily increased to form silicon-rich oxide layer 42. Next, a silicon oxide layer 44 is formed using a HDPCVD process on the silicon-rich layer 42.

Figure 5:
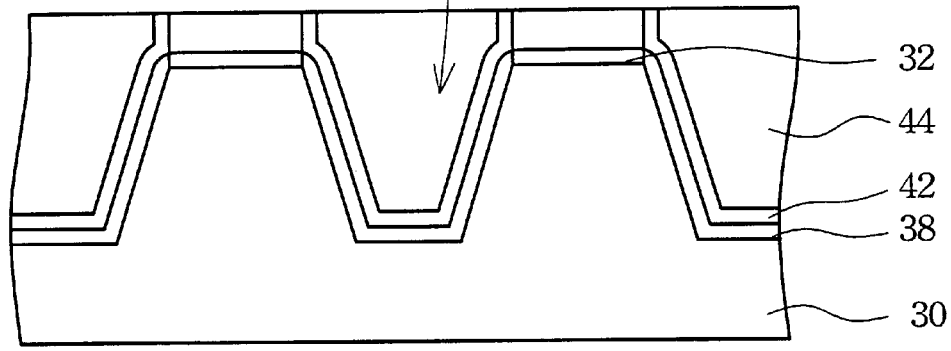

Referring to FIG. 5, the excess portion of silicon oxide 44 and the silicon-rich oxide layer 42 over the silicon nitride layer may be effectively removed using some standard semiconductor processes, such as CMP or etching back.

Figure 6:
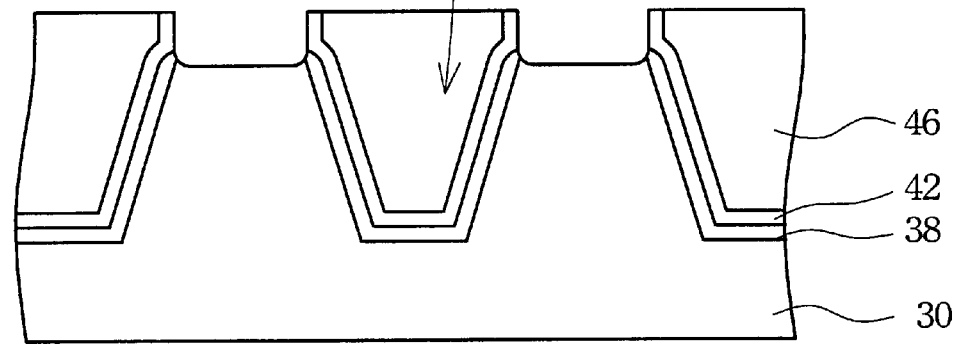

Referring to FIG. 6, the mask layer 34 is removed using $H_3PO_4$ etchant, and the pad oxide layer 32 is stripped using HF etchant to form silicon oxide plug 46, served as a shallow trench isolation.

The etch rate of the pad oxide layer 32 and the lining oxide layer 38 formed by thermal oxidation is apparently smaller than that of the silicon oxide plug 46 formed by HDPCVD using HF as an etchant. However, since the silicon concentration of silicon-rich oxide layer 42 is higher, the etching rate of silicon oxide layer 44 formed by HDPCVD process is smaller than that of silicon oxide formed by thermal oxidation process.

The etching rate of the silicon oxide layer formed by thermal oxidation is defined as 1. The wet etching rate of silicon-rich oxide layer with respect to silicon oxide layer formed by thermal oxidation using HF has a ratio of between about 1.2 and about 1.5. The flow rate of reactant gases, such as $O_2$, $SiH_4$ and helium (He), are 225, 150 and 400 standard cubic centimeters per minute (sccm) respectively wherein the flow rate ratio of $O_2/SiH_4$ is 1.5. The wet etching rate ratio of silicon-rich oxide layer with respect to silicon oxide layer formed by thermal oxidation using HF has a ratio of between about 0.5 and about 0.9. The flow rate of reactant gases, such as $O_2$, $SiH_4$ and He, are 175, 150 and 400 standard cubic centimeters per minute (sccm) respectively, wherein the flow rate ratio of $O_2/SiH_4$ is 1.16. As a result, when the pad oxide layer 32 is being removed, the silicon-rich oxide layer 42 may provide a better prevention for the edge of silicon oxide plug 46 from recesses.

Additionally, some electric experiments of the shallow trench 36 in accordance with the present invention are evidently shown that measurements of the interface trapping density between shallow trench isolation and the substrate 30 is light than those of the prior art. This may indicates that an interface recess between the shallow trench isolation and the substrate is effectively inhibited, and thus decrease on current leakage is possible.

Moreover, electric experiments of the flat-band voltage of shallow trench 36 according to the present invention and the conventional respectively are implemented. Generally, the flat-band voltage is defined as zero with respect to an ideal silicon oxide layer formed by thermal oxidation process. In the experimental results, the flat-band voltage of shallow trench isolation in the present invention tends to be zero, which indicates that the defects of shallow trench 36 are not as severe as those appeared in the prior art.

From the above electric experiments, before a silicon oxide is refilled into the shallow trench 36, a silicon-rich oxide layer 42 is formed using the HDPCVD process so that the damage of the inner surface of the shallow trench 36 are effectively inhibited due to a large amount of plasma ions. Consequently, interface defects between shallow trench 36 and substrate are restricted, and the probability of current leakage is reduced.

The present invention utilizes in-situ two-step deposition of HDPCVD process to form a silicon-rich oxide layer 42 characterized as a low wet etching rate and low plasma damage and silicon oxide layer 44. Besides employed in the complement metal oxidation semiconductor (CMOS) manufacturing process, the present invention is also appropriate for some semiconductor processes, such as logic devices and memory devices (flash memory and the like.).

Hence, the process of manufacturing for shallow trench isolation is described in the present invention, wherein the silicon-rich oxide layer 42 is used as protection for the silicon oxide plug 46 from the recesses. Additionally, the damage of the inner surface of the shallow trench 36 are effectively inhibited resulted from a large amount of plasma ions, and the probability of current leakage is thus decreased owing to the controlled defects between shallow trench 36 and substrate 30. Most importantly, the throughput of manufacturing process according to the present invention will not be influenced, which in-situ two-step deposition is implemented, each step with the same HDPCVD process.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for forming shallow trench isolation, comprising:
   forming a pad oxide layer on a substrate;
   forming a mask layer on said pad oxide layer;
   forming openings on said mask layer and said pad oxide layer such that regions of said substrate are exposed;
   etching said exposed regions for forming trenches on said substrate;
   forming a lining oxide layer on the sidewalls of said trenches;
   forming a silicon-rich oxide layer on said lining oxide layer and said mask layer respectively;
   filling said trench by forming a silicon oxide layer on said silicon-rich oxide layer;
   removing the excess portion of said silicon oxide layer and said silicon-rich layer over said mask layer such that said mask layer is exposed;
   removing said mask layer; and
   removing said pad oxide layer by using hydrofluoric acid (HF).

2. The method of claim 1, wherein said silicon-rich oxide layer has a thickness of between about 500 to about 2000 angstroms.

3. The method of claim 1, wherein said silicon-rich oxide layer is formed using a high-density plasma chemical vapor deposition (HDPCVD) process.

4. The method of claim 3, wherein the flow rate of oxygen ($O_2$) to silane ($SiH_4$) of said HDPCVD process has a ratio of between about 1.00 and about 1.33.

5. The method of claim 1, wherein the wet etching rate ratio of said silicon-rich oxide layer to said silicon oxide layer formed by thermal oxidation using HF has a ratio of between about 0.5 and about 0.9.

6. The method of claim 1, wherein said silicon oxide layer is formed using a HDPCVD process.

7. The method of claim 6, wherein the flow rate of oxygen ($O_2$) to silane ($SiH_4$) of said HDPCVD process has a ratio of between about 1.40 and about 1.60.

8. The method of claim 1, wherein the wet etching rate of said silicon oxide layer to said silicon oxide layer formed by thermal oxidation using HF has a ratio of between about 1.2 and about 1.5.

9. A method for forming shallow trench isolation, comprising the steps of:

patterning a mask layer on a substrate to expose a portion of said substrate;

etching said exposed substrate for forming trenches on said substrate;

forming a first silicon oxide layer on said trenches and said substrate using a HDPCVD process wherein the flow rate of $O_2/SiH_4$ has a ratio of between about 1.00 and about 1.33;

filling said trench by forming a second oxide layer on said first silicon oxide layer using a HDPCVD process wherein the flow rate of $O_2/SiH_4$ has a ratio of between about 1.40 and about 1.60;

removing an excess portion of said second silicon oxide layer and said first silicon oxide layer over said mask layer to expose said mask layer; and removing said mask layer.

10. The method of claim 9, wherein said first silicon oxide layer has a thickness of between about 900 to about 1100 angstroms.

11. The method of claim 9, wherein the $O_2$ flow rate has a range of between about 150 and about 200 sccm.

12. The method of claim 9, wherein the $SiH_4$ flow rate has a rate of about 150 sccm.

13. A method for forming shallow trench isolation, comprising the steps of:

forming a pad oxide layer on a substrate;

forming a mask layer on said pad oxide layer;

patterning said mask layer and said pad oxide layer to expose regions of said substrate;

etching said exposed substrate for forming trenches on said substrate;

forming a first silicon oxide layer on said trenches and said substrate using a HDPCVD process wherein the wet etching rate of said first silicon oxide layer to said silicon oxide layer formed by thermal oxidation using HF has a ratio of between about 0.5 and about 0.9;

filling said trench by forming a second silicon oxide layer on said first silicon oxide layer using said HDPCVD process wherein said wet etching rate ratio of said first silicon oxide layer with respect to said silicon oxide layer formed by thermal oxidation using HF has a ratio of between about 1.2 and about 1.5;

removing an excess portion of said second silicon oxide layer and said first silicon oxide layer over said mask layer to expose said mask layer;

removing said mask layer; and removing said pad oxide layer by HF.

14. The method of claim 13, wherein said first silicon oxide layer has a thickness of between about 900 and about 1100 angstroms.

15. The method of claim 13, wherein said first silicon oxide layer is formed using a HDPCVD process having a flow rate ratio of $O_2/SiH_4$ of between about 1.00 and about 1.33.

16. The method of claim 13, wherein said second silicon oxide layer is formed using a HDPCVD process having a flow rate ratio of $O_2/SiH_4$ of between about 1.40 and about 1.60.

* * * * *